United States Patent [19]

Porter

[11] 4,053,830

[45] Oct. 11, 1977

[54] ARMATURE WINDING TERMINATION CONTINUITY TESTER AND METHOD

[75] Inventor: James L. Porter, Shaker Heights, Ohio

[73] Assignee: Avtron Manufacturing, Inc., Cleveland, Ohio

[21] Appl. No.: 740,559

[22] Filed: Nov. 10, 1976

[51] Int. Cl.² ............... G01R 31/02; G01R 31/04
[52] U.S. Cl. .............................. 324/51; 324/158 MG
[58] Field of Search ................. 324/51, 55, 158 MG, 324/73

[56] References Cited

U.S. PATENT DOCUMENTS

| | | | |
|---|---|---|---|
| 1,494,232 | 5/1924 | Friedly | 324/51 |
| 2,463,567 | 3/1949 | Samstag | 324/51 |
| 3,270,277 | 8/1966 | Ward | 324/158 MG UX |
| 3,307,102 | 2/1967 | Norkaitis | 324/51 |
| 3,435,327 | 3/1969 | Merhof et al. | 324/158 MG X |
| 3,539,923 | 11/1970 | Tsergas | 324/51 X |

*Primary Examiner*—Gerard R. Strecker

[57] ABSTRACT

Apparatus and method are disclosed for testing winding terminations and more particularly for testing armature winding termination continuity. A nonrotating, simultaneous test is made of the armature winding terminations to commutator bars by simultaneously applying equal currents to different sets of bar-to-bar winding terminations. The differences in the bar-to-bar voltages of selected pairs of bar-to-bar terminations are obtained and a determination is made as to whether any voltage difference exceeds a reference limit. If not, then an acceptable continuity test indication is given.

13 Claims, 7 Drawing Figures

ARMATURE WINDING TERMINATION CONTINUITY TESTER AND METHOD

This invention relates to the art of electrically testing windings and, more particularly, to determining whether armature windings are properly terminated to armature commutator bars.

Testing for high quality termination of armature windings to commutator bars has been difficult, expensive, and inadequate for automated high-volume production products. Hot staking and tang fusing operations are inconsistent enough to require a 100% bar to winding continuity test. A fast test with maximum sensitivity to connection resistance (weld resistance) is required. Measurement of weld resistance is complicated by restrictions to connect only to commutator bars, by wire resistance variations, by wire stretch variations, and by varying coil lengths inherent in the winding process. Test time must be minimized in automated production, and sequential tests are unsatisfactory, especially for armatures with many commutator bars.

One test employed in the prior art for measuring armature commutator continuity involves measuring the resistance between diametric bar pairs while rotating the armature between measurement brushes. This is a very time consuming testing procedure and is not desirable for use in automatic testing.

Another prior art test involves individually measuring each adjacent bar-to-bar resistance and manually evaluate deviations from the expected variations in the resistance. Again, this is a tedious process and does not lend itself to automatic test procedures.

It is an object of the present invention to provide apparatus and method for testing armature termination continuity wherein all of the commutator bar-to-bar winding terminations are tested simultaneously, permitting use of automatic test equipment for high-volume production.

It is a still further object of the present invention to employ such testing which does not require rotation of the armature between measurement brushes.

In accordance with the present invention, apparatus and method are provided for testing armature winding termination continuity of armatures that have an array of commutator bars and a plurality of armature windings with each winding having its opposite ends terminated to different commutator bars to thereby define a plurality of sets of bar-to-bar winding terminations. The test is performed by simultaneously applying test currents of equal value so as to flow through each of the sets to develop respective bar-to-bar voltages. The voltage differences are measured between the voltages developed across different selected pairs of all of the sets being tested. A determination is made as to whether any of these voltage differences exceeds a reference limit and an output indication is given dependent on the determination.

DESCRIPTION OF THE DRAWINGS

The foregoing and other objects and advantages of the invention will become more readily apparent from the following description of the preferred embodiments of the invention as taken in conjunction with the accompanying drawings which are a part hereof and wherein.

DETAILED DESCRIPTION

Figure 1:
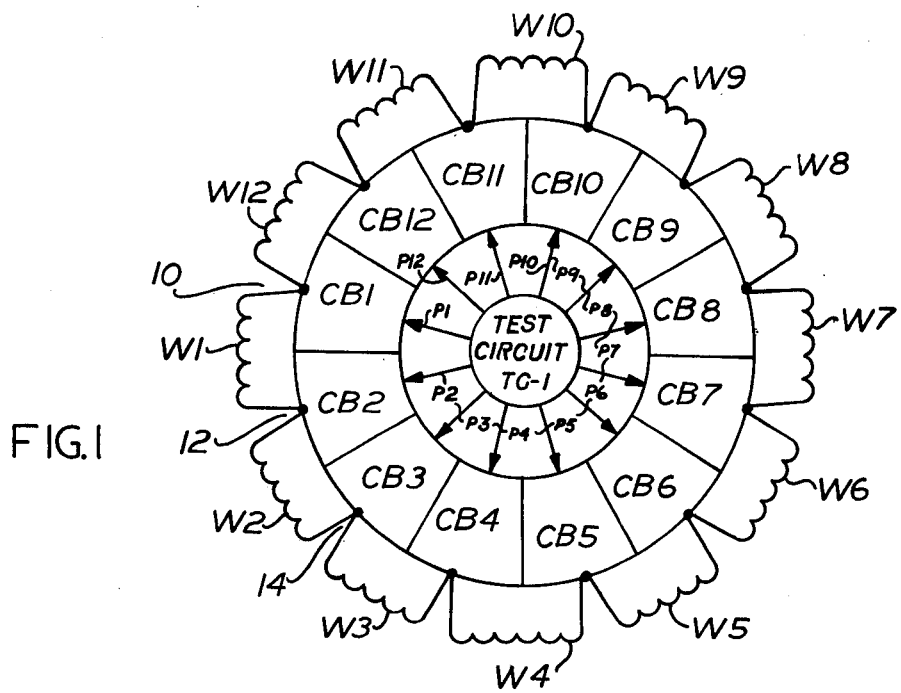
FIG. 1 is a schematic illustration of one application of the invention wherein a test circuit, in accordance with the invention, is employed for testing the continuity of a plurality of sets of armature winding terminations.

Reference is now made to the drawings wherein the showings are for purposes of illustrating preferred embodiments of the invention only and not for purposes of limiting same. Reference is now made specifically to FIG. 1 which schematically illustrates a circular array of armature commutator bars. In the general case, the number of commutator bars may be either an even or an odd number. In the example in FIG. 1, however, there are 12 commutator bars, CB-1 through CB-12. This is an even number and which is divisible by 4. This point will be made pertinent with respect to the discussion given hereinafter relative to the test circuit TC-1 of FIG. 3. In the example of FIG. 4, there is also an even number of commutator bars with the number being 10 and which is not divisible by 4. A still further example given herein is with reference to FIG. 6 which illustrates an application of the invention to an armature wherein there is an odd, in this case 11, number of commutator bars.

The armature of FIG. 1 has a plurality of armature windings, W1 through W12, and these windings have their opposite ends terminated to different ones of the commutator bars. In the example given, each winding has its opposite ends terminated, as by a weld, to adjacent commutator bars, although within the framework of the present invention the terminations could be with other than adjacent commutator bars. Also, the terminations need not be welds. In FIG. 1, winding W1, for example, has its opposite ends terminated by welds at 10 and 12 to adjacent commutator bars CB-1 and CB-2. In a similar manner, armature winding W2 has its opposite ends terminated to commutator bars CB-2 and CB-3 by welds 12 and 14. The remaining windings are terminated in a similar manner, as is shown in FIG. 1.

A test circuit TC-1 is employed for testing the armature winding termination continuity. As is common, the weld terminations may involve hot staking and tang fusing operations. Such terminations are sufficiently inconsistent to require a 100% bar-to-winding continuity test. The test circuit of the present invention permits a quick, simultaneous test of all commutator bar connections.

Figure 2:
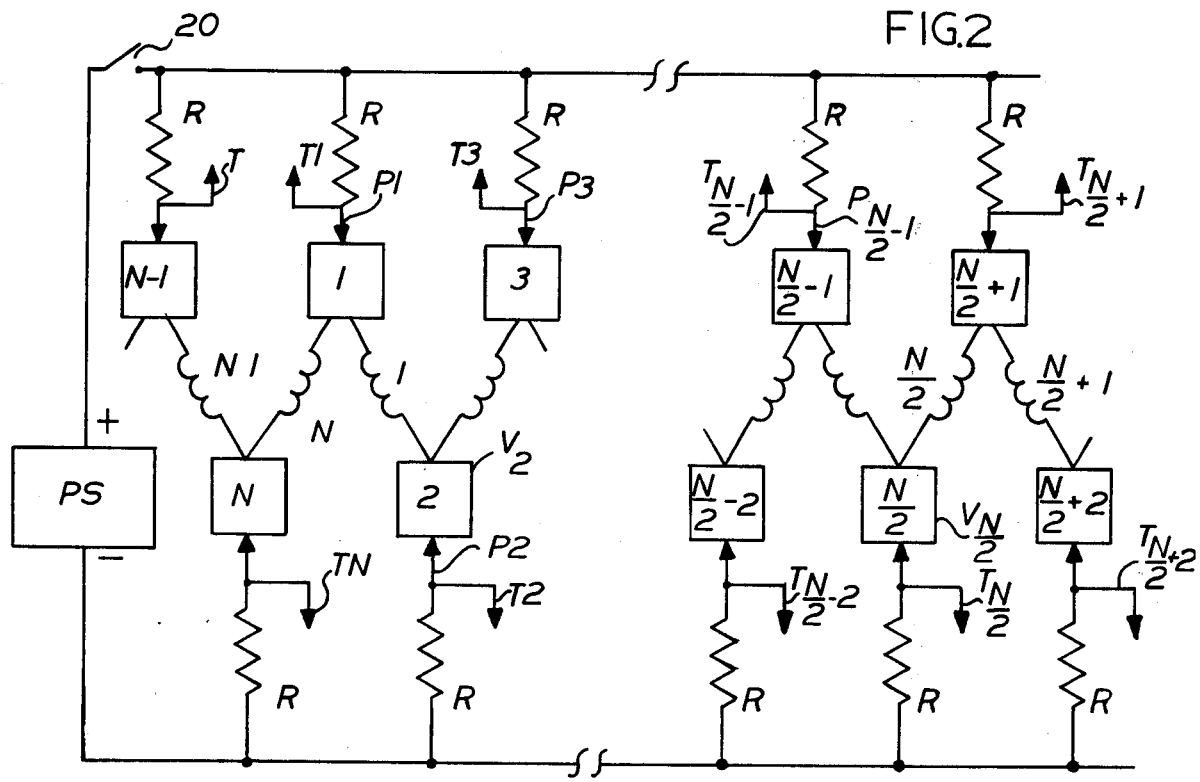
FIG. 2 is a schematic circuit diagram illustrating the manner in which a portion of the test circuit is connected to the commutator bars.
Figure 3:
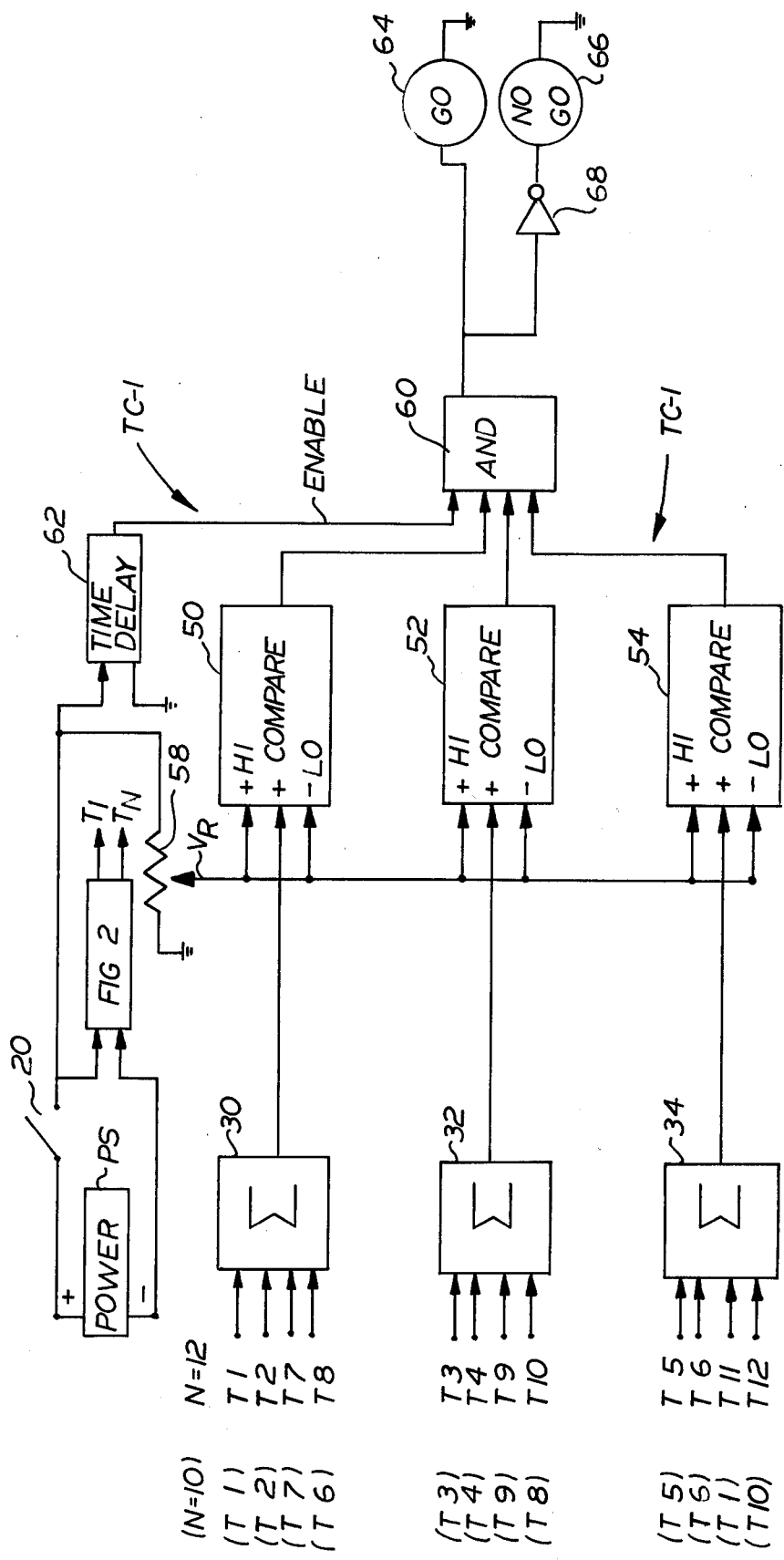
FIG. 3 is a schematic illustration of the test circuit.
Figure 4:
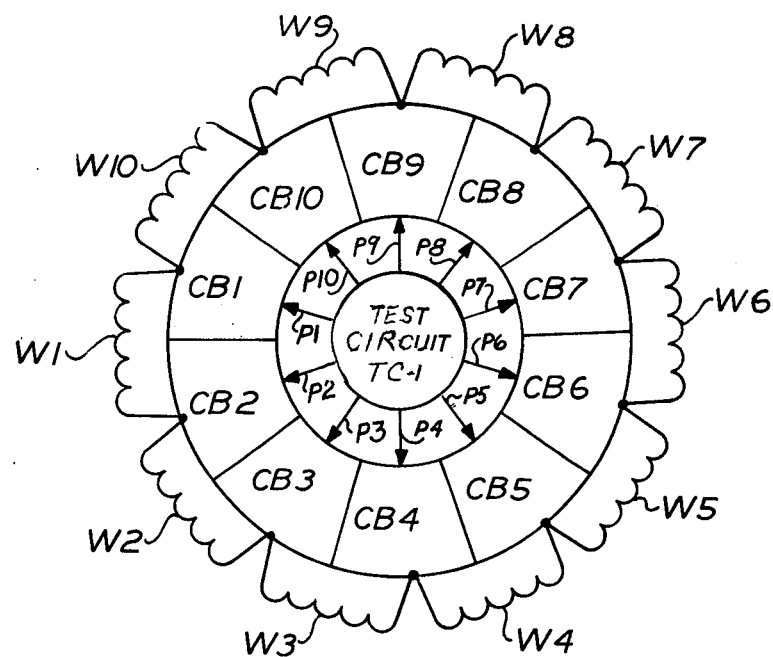
FIG. 4 is a schematic illustration similar to that of FIG. 1 illustrating the manner in which the test circuit may be connected to the commutator bar arrangement employing an even number of armature windings, such as 10, wherein the number is not divisible by 4.

The test circuit TC-1 shown in FIGS. 1, 2, and 3, includes a plurality of electrical contact probes P1 through P12 which serve to make electrical contact with commutator bars CB-1 through CB-12, respectively. As schematically illustrated in FIG. 2, each probe P1 through P12 is connected in series with a resistor R to one side of a power supply source. All of the resistors are of equal value R. In the application of the invention as shown in FIGS. 1 and 2, the first, third, fifth, etc. commutator bars are connected through associated resistors to the positive side of the DC power supply source P.S., whereas the second, fourth, sixth, etc. commutator bars are connected through their associated resistors to the negative side of the power supply source P.S. The test circuit also includes a plurality of test terminals T1 through T12 respectively connected to associated probes P1 through P12 (see FIGS. 2 and 3). As will be explained with specific reference to FIG. 3, these test terminals T1 through T12 serve, after power has been applied as by closing switch 20, to provide signals to the circuitry of the test circuit for determination of the armature winding termination continuity.

Reference is now made specifically to FIG. 3. Upon closure of switch 20, power is supplied to the probes P1 through P12 (FIGS. 1 and 2) so that current flows through the various sets of armature winding terminations such that twice as much current flows through each bar connection as that through a coil winding. Thus, the sensitivity to weld resistance unbalance is twice as high as sensitivity to coil resistance unbalance. Since all of the windings are simultaneously energized, signals will appear at terminals T1 through T12 representative of the voltages with respect to the negative side of the power supply at these various terminal points. The differences in voltages resulting across essentially diametrically opposed bar-to-bar terminations are compared against acceptable limit ranges to determine if the bar connections exhibit excessive resistance. This pairing is preferred because in a perfectly balanced double flyer would armature, the current flowing through the coils and the resulting voltages of diametrically opposed windings should be essentially identical. Any difference between the bar-to-bar voltage on one side of the armature as compared to the diametric bar-to-bar voltage will be a function of coil unbalance and termination resistance. With a properly chosen reference limit to exclude normal coil variations, any excessive voltage differences will primarily be due to variations in termination resistance.

The circuitry employed to measure differences in voltages existing at diametrically opposed bar-to-bar winding terminations is illustrated in FIG. 3. This circuitry also serves to determine whether any differences existing in the voltages falls within an acceptable range of resistance variations.

Figure 3A:
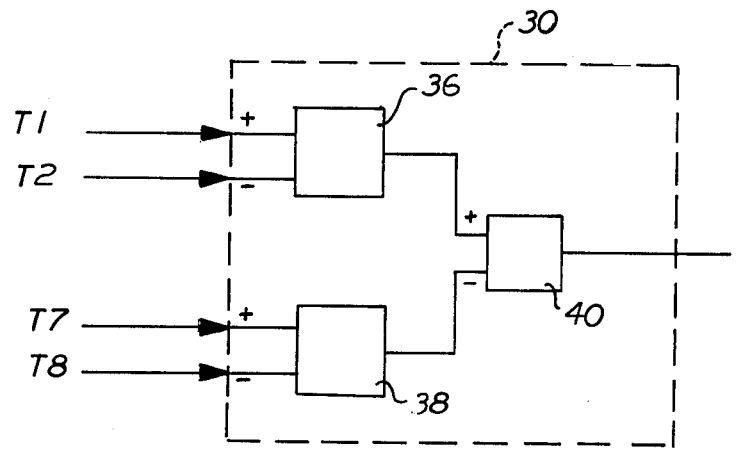
FIG. 3A is a schematic illustration of a portion of the circuit shown in FIG. 3.

The voltage signals at the probe terminals T1 through T12 are applied to summing circuits in the manner as shown in FIG. 3. Three summing circuits 30, 32, and 34 are employed for an arrangement having 12 sets of winding terminations to be tested. Referring to FIG. 1, a first set of winding terminations includes the path from commutator CB-1, termination 10, winding W1, and termination 12 to commutator CB-2. A second set extends from commutator CB-3 to commutator CB-4 and so on. Twelve such sets are provided by the arrangement of FIG. 1. The voltage across the first set is obtained by subtracting the voltage at terminal T2 from the voltage at terminal T1. Similarly, the voltage across the diametrically opposite set is obtained by subtracting the voltage at terminal T8 from the voltage at terminal T7. The voltages at terminals T1, T2, T7, and T8 are applied to a four input summing amplifier 30 with the terminals being connected to the inputs of the amplifier with the polarities as indicated in FIG. 3. For the purposes of illustration, the summing amplifier 30 may take the form as shown in FIG. 3A wherein a first summing amplifier 36 provides an output voltage dependent upon the voltage difference at terminals T1 and T2 and a second summing amplifier 38 provides an output voltage representative of the voltage difference at terminals T7 and T8. These two voltage differences are, in turn, applied to a summing amplifier 40 which provides an output voltage representative of any difference between the bar-to-bar voltage on one side of the armature compared to the diametrically opposed bar-to-bar voltage.

Summing amplifiers 32 and 34 are constructed in the same manner as summing amplifier 30 and differ therefrom only in that the voltages applied to the four inputs are obtained from different terminals, as labeled in FIG. 3. In this way, the output voltage obtained from summing amplifier 30 is representative of the difference between the voltage existing across commutator bars CB-1 and CB-2 on one side of the armature and the voltage between commutator bars CB-7 and CB-8 on the other side of the armature. Similarly, any voltage obtained at the output of summing amplifier 32 is representative of any voltage difference between the voltage across commutator bars CB-3, CB-4, and commutator bars CB-9 and CB-10. Any voltage obtained from amplifier 34 is representative of any voltage difference between the bar-to-bar voltages across commutator bars CB-5, CB-6, and CB-11, CB-12.

The voltages obtained at the outputs of summing amplifiers 30, 32, and 34 are respectively applied to the positive inputs of window comparators 50, 52, and 54. Each window comparator, such as comparator 50, provides a positive output signal only if the voltage applied from its associated summing amplifier is of any value between acceptable low and high limits. Because of the polarity possibilities, the acceptable low level limit is a negative level and the acceptable high level limit is a positive level. The voltage swing with respect to ground may be of equal amount and, hence, a single positive reference voltage VR may be applied to both the hi input and the low input of each comparator. This signal is obtained from the wiper arm of a suitable potentiometer 58.

The symmetry involved in testing diametric bar-to-bar voltages, as with summing amplifiers 30, 32, and 34, cancels the effects of any variations in coil sizes caused by excessively wound coils by a double flyer winding machine. Also, the inductance of the armature should match for diametrically opposed coils and the limit checking of the different voltages can be made before test transients decay without inducing errors.

If the voltage differences applied to comparators 50, 52, and 54 are all within the acceptable low-high limits, then each comparator will produce a binary "1" signal. These binary "1" signals are applied to an AND gate 60. The AND gate is enabled so as to pass the results of comparators 50, 52, and 54 after a slight time delay has elapsed from the closure of switch 20. Consequently, the test circuit employs a time delay circuit 62 which, upon closure of switch 20, times a short time delay and then applies a binary "1" signal to the AND gate 60. If all the comparators provide binary "1" signals at this time, then the AND gate will energize a suitable indicator in the form of a GO lamp 64. If any one of the comparisons is unfavorable, then the AND gate 60 will not produce a binary "1" signal and, hence, a NO-GO lamp 66 is energized through an inverter 68.

ALTERNATIVE EMBODIMENTS

Figure 5:
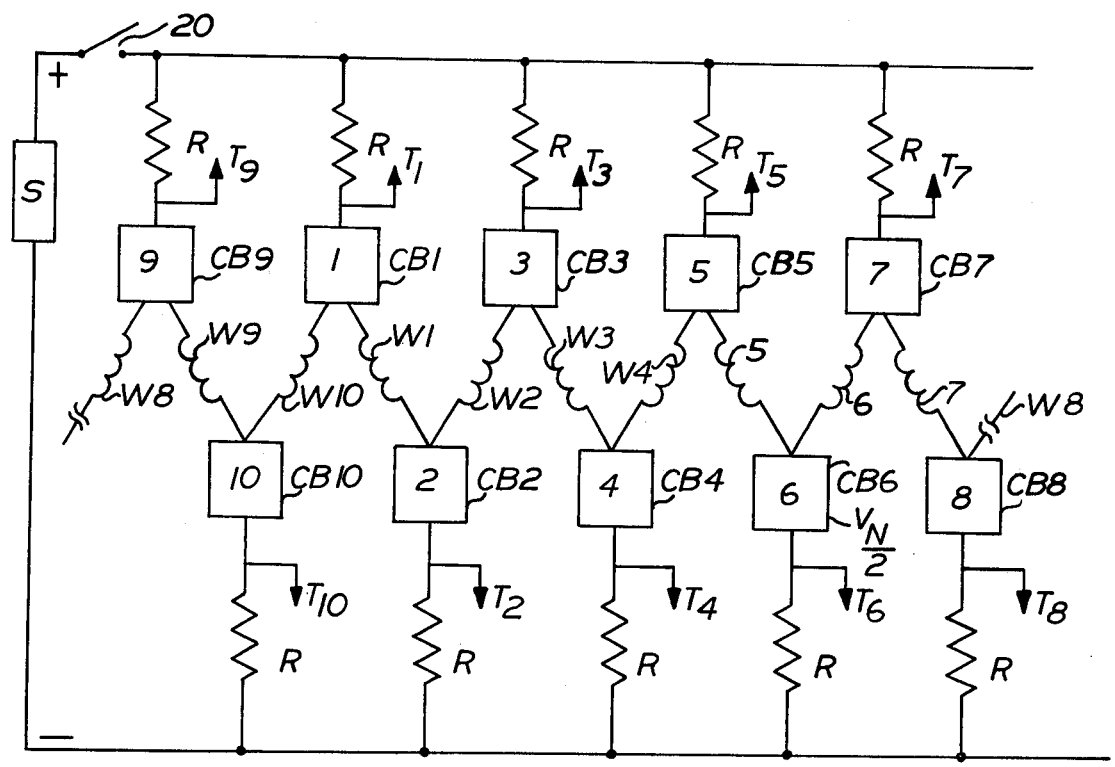
FIG. 5 is a schematic illustration showing the manner in which the probes are electrically connected to the commutator bars of FIG. 4; and, FIG. 6 is a schematic illustration similar to FIGS. 1 and 4, but showing the manner in which the test circuit may be connected to an armature having an odd number of commutator bars, such as 11.

Reference is now made to FIGS. 4 and 5 which illustrates the application of the test circuit in accordance with the present invention to testing continuity winding terminations of an armature having an even number of windings, such as 10, but wherein the number is not divisible by 4 as in the case of the example given in FIGS. 1 and 2. To facilitate an understanding of the invention, like components in the embodiment of FIGS. 1 and 2 and in the embodiment of FIGS. 4 and 5 are identified with like character references. Only the deviations will be described in detail below.

The test circuit TC-1 in FIG. 4 is essentially the same as the test circuit TC-1 of FIG. 1 with the exception that only 10 electrical probes, P1 through P10, are employed. These 10 probes are respectively connected to commutator bars CB-1 through CB-10. The connection arrangement shown in FIG. 5 differs somewhat from that of the embodiment shown in FIG. 2. In FIG. 5 there are only 10 output terminals, T1 through T10, to provide voltages to the circuitry of FIG. 3. These 10 terminals, as in the case of the embodiment in FIG. 2, are taken from probes P1 through P10 respectively.

The test circuit of FIG. 3 is employed with either of the embodiments of FIGS. 1, 2, or FIGS. 4, 5 and only minor changes are made. These deal only with manner of connecting terminals T1 through T10 to the summing amplifiers 30, 32, and 34. As shown with respect to summing amplifier 30, terminals T1, T2, T7, and T8 are normally connected in the manner as shown for use with the winding connection of FIGS. 1 and 2. However, with respect to the winding connections of FIGS. 4 and 5, the terminal connections are those shown immediately to the left in FIG. 3, as (T1), (T2), (T6), and (T7). Similar designations are made immediately to the left of comparators 32 and 34. These changes are required because each summing amplifier preferably serves to provide an output voltage representative of the difference between commutator bar-to-bar voltages on diametrically opposite sides of the armature. In the configuration shown in FIGS. 4 and 5, one side of the armature would include the bar-to-bar voltage taken across commutator bars CB-1 and CB-2 and the diametrically opposed bar-to-bar voltage would be that existing between commutator bars CB-6 and CB-7 (and not CB-7 and CB-8 as in the embodiment of FIGS. 1 and 2). A similar explanation is true for the terminal connections for summing amplifiers 32 and 34. Note that for amplifier 34 that the comparison is made between the voltages across commutator bars CB-5, CB-6 and that between commutator bars CB-10, CB-1 (and not CB-11, CB-12 as in the arrangement of FIGS. 1 and 2). Terminals T1 and T6 are used twice in testing the arrangement of FIGS. 4 and 5 in order to achieve testing of diametrically opposed bar-to-bar terminations.

Figure 6:
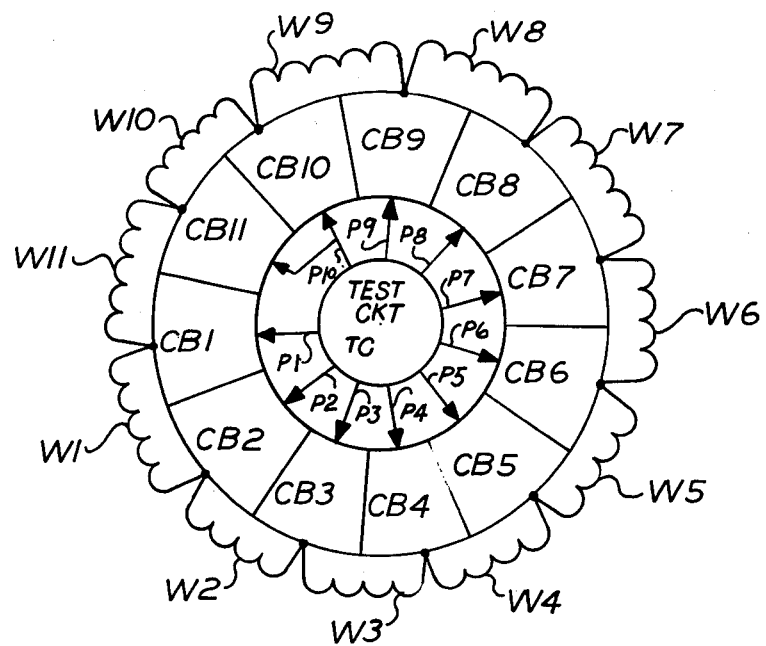

In the event that an armature to be tested employs an odd number of armature windings, then the test circuit is employed in the manner as shown in FIG. 6. In this example, there are 11 commutator bars CB-1 through CB-11. The test circuit deviates from the ten bar test circuit (FIGS. 4, 5) only in that commutator bars CB-10 and CB-11 are shorted together. Thus, an armature having 11 commutator bars is treated as if it only has 10 commutator bars with the test being performed exactly in the manner discussed hereinbefore with reference to the 10 bar arrangement of FIGS. 4 and 5.

In each of the embodiments described herein, armature winding terminations are tested for acceptable ranges of continuity. A simultaneous, nonrotating test is made of all the winding terminations. Although the test preferably involves applying DC currents, AC currents could also be used with some loss of sensitivity due to winding inductance. The test is preferably of commutator bar-to-bar terminations on opposite sides of an armature. The comparisons could be made with other than diametrically opposed bar-to-bar terminations, but with some loss in sensitivity due to possible variations in coil sizes.

The foregoing invention has been described with respect to preferred embodiments, and it is to be appreciated that the invention is not limited thereto as various modifications in components and methods may be made without departing from the spirit and scope of the invention as defined by the appended claims.

What is claimed is:

1. Apparatus for testing armature winding termination continuity of an armature having a circular array of commutator bars and a plurality of armature windings each having its opposite ends terminated to a different one of said bars so as to define a plurality of sets of bar-to-bar winding terminations, comprising:
   means for simultaneously applying test currents of equal value to flow through each said set of bar-to-bar winding terminations to develop respective bar-to-bar voltages;
   means for simultaneously measuring voltage differences between the voltages developed across different selected pairs of all of said sets of bar-to-bar winding terminations;
   means for simultaneously determining whether any of said voltage differences exceeds a reference limit; and,
   means for providing an output indication dependent upon said determination.

2. Apparatus as set forth in claim 1, wherein the number of said sets of bar-to-bar winding terminations to be tested corresponds in number with the number of armature windings on said armature.

3. Apparatus as set forth in claim 1, wherein each said selected pair of said sets of bar-to-bar winding terminations includes sets which are essentially on diametrically opposite sides of said armature.

4. Apparatus as set forth in claim 3, wherein there is an even number of said armature windings and the number of said bar-to-bar winding terminations corresponds with the number of said armature windings.

5. Apparatus as set forth in claim 1, wherein each said winding termination is defined by a weld connection of a said winding end to a said commutator bar.

6. Apparatus as set forth in claim 1, wherein said test current applying means includes a single power supply source and means for simultaneously connecting said source to each said set of bar-to-bar winding terminations.

7. Apparatus as set forth in claim 6, wherein said power source is a DC voltage supply source.

8. Apparatus as set forth in claim 1, wherein each set of bar-to-bar winding terminations is defined by a pair of adjacent ones of said commutator bars.

9. Apparatus as set forth in claim 1, wherein said test current applying means includes circuit means for applying current to said sets of bar-to-bar winding terminations such that essentially twice as much current flows through each termination as that through each winding.

10. Apparatus as set forth in claim 4, wherein each said set of bar-to-bar winding terminations is defined by a pair of adjacent ones of said commutator bars, said test current applying means including a single DC voltage supply source and circuit means connected thereto in such a manner for applying DC current to said sets of bar-to-bar winding terminations such that essentially twice as much current flows through each termination as that through each winding.

11. A method for testing armature winding termination continuity of an armature having a circular array of commutator bars and a plurality of armature windings each having its opposite ends terminated to a different one of said bars so as to define a plurality of sets of bar-to-bar winding terminations, comprising the steps of:
 simultaneously applying test currents of equal values to flow through each of said sets so as to develop respective bar-to-bar voltages;
 simultaneously measuring the voltage differences between the voltages developed across different selected pairs of all of said sets;
 simultaneously determining whether any of said voltage differences exceeds a reference limit; and,
 providing an output indication dependent upon said determination.

12. Apparatus for testing armature winding termination continuity of an armature having a plurality of armature windings each having its opposite ends terminated to respective different commutator bars so as to define a plurality of bar-to-bar winding terminations in a circular array of said commutator bars and comprising:
 a plurality of N impedence networks of equal values, wherein N is an even number and the number of said windings is at least equal to N;
 a plurality of at least N electrical test probes for simultaneously electrically contacting a respective different one of said commutator bars;
 means for connecting alternate ones of said test probes through a respective one of said impedence networks to one side of a power source;
 means for connecting the intermediate ones of said test probes through a respective one of said impedence networks to a second side of a said power source;
 means for simultaneously electrically measuring the voltage differences between selected different pairs of said bar-to-bar winding terminations;
 means for simultaneously comparing each of said voltage differences with a reference limit to determine if any of said voltage differences exceeds said reference limit; and,
 means for providing an output indication dependent upon said determination.

13. Apparatus as set forth in claim 12 wherein said selected different pairs comprises N/2 different pairs.

* * * * *